United States Patent
Ishizaka et al.

(10) Patent No.: US 8,377,407 B2
(45) Date of Patent: Feb. 19, 2013

(54) CARBONATE CRYSTAL, MANUFACTURING METHOD THEREOF, AND TRANSPARENT OPTICAL RESIN COMPOSITION

(75) Inventors: Tatsuya Ishizaka, Kanagawa (JP); Tetsuo Kawano, Kanagawa (JP)

(73) Assignee: FUJIFILM Corporation, Minato-Ku, Tokyo (JP)

( * ) Notice: Subject to any disclaimer, the term of this patent is extended or adjusted under 35 U.S.C. 154(b) by 1077 days.

(21) Appl. No.: 11/792,507

(22) PCT Filed: Dec. 13, 2005

(86) PCT No.: PCT/JP2005/023198
§ 371 (c)(1),
(2), (4) Date: Jun. 7, 2007

(87) PCT Pub. No.: WO2006/064929
PCT Pub. Date: Jun. 22, 2006

(65) Prior Publication Data
US 2009/0124744 A1    May 14, 2009

(30) Foreign Application Priority Data

Dec. 15, 2004 (JP) .................................. 2004-363469
Jun. 8, 2005 (JP) .................................. 2005-167735

(51) Int. Cl.
*C01F 11/18* (2006.01)
*C08K 3/26* (2006.01)

(52) U.S. Cl. ...................... 423/419.1; 423/430; 423/433; 524/424; 524/425

(58) Field of Classification Search .................. 524/424, 524/425; 423/161, 165, 430, 432; 523/513
See application file for complete search history.

(56) References Cited

U.S. PATENT DOCUMENTS
(Continued)

FOREIGN PATENT DOCUMENTS
JP        59-203728 A    11/1984
JP        2004-035347 A    2/2004
(Continued)

OTHER PUBLICATIONS
Tagata et al. Science. 2003. vol. 301. pp. 812-814.*
(Continued)

*Primary Examiner* — Liam Heincer
*Assistant Examiner* — Michael A Salvitti
(74) *Attorney, Agent, or Firm* — Buchanan Ingersoll & Rooney PC

(57) ABSTRACT

The object of the present invention is to provide a carbonate crystal, which has oriented birefringence, is needle- or rod-like, and is able to negate the birefringence without sacrificing the light transmittance of a transparent polymeric resin when it exists in the transparent resin; a manufacturing method of the carbonate crystal; and a transparent optical resin composition comprising the carbonate resin. The carbonate crystal has an aspect ratio of two or greater, the average major axis length of 400 nm or shorter, and the variation coefficient expressed in Formula (1) below is 0.40 or less:

$$\frac{1}{r} \times \left\{ \frac{1}{n-1} \sum_{i=1}^{n}(r_i - r)^2 \right\}^{\frac{1}{2}}$$   Formula (1)

wherein r denotes an average major axis length, n denotes the number of particles used for the measurement of the major axis length, and n denotes the major axis length of the $i^{th}$ particle measured.

16 Claims, 1 Drawing Sheet

U.S. PATENT DOCUMENTS

| | | |
|---|---|---|
| 5,164,172 A | 11/1992 | Katayama et al. |
| 2005/0255027 A1* | 11/2005 | Hirai et al. .................. 423/430 |
| 2008/0241048 A1* | 10/2008 | Kawano .................. 423/432 |
| 2008/0260614 A1* | 10/2008 | Tetsuo .................. 423/430 |

FOREIGN PATENT DOCUMENTS

| | | |
|---|---|---|
| JP | 2004-109355 A | 4/2004 |
| JP | 2004-535930 A | 12/2004 |
| WO | WO 96/23728 * | 1/1996 |
| WO | WO 01/25364 A1 | 4/2001 |
| WO | WO 03/011761 A1 | 2/2003 |

OTHER PUBLICATIONS

AIPN machine translation of Koike JP 2004-035347.*

Beecroft et al. Chem. Mater. 1997, 1302-1317.*

Strontium Hydroxide MSDS. Obtained from JTBaker.com. No Author, No Date.*

International Search Report.

* cited by examiner

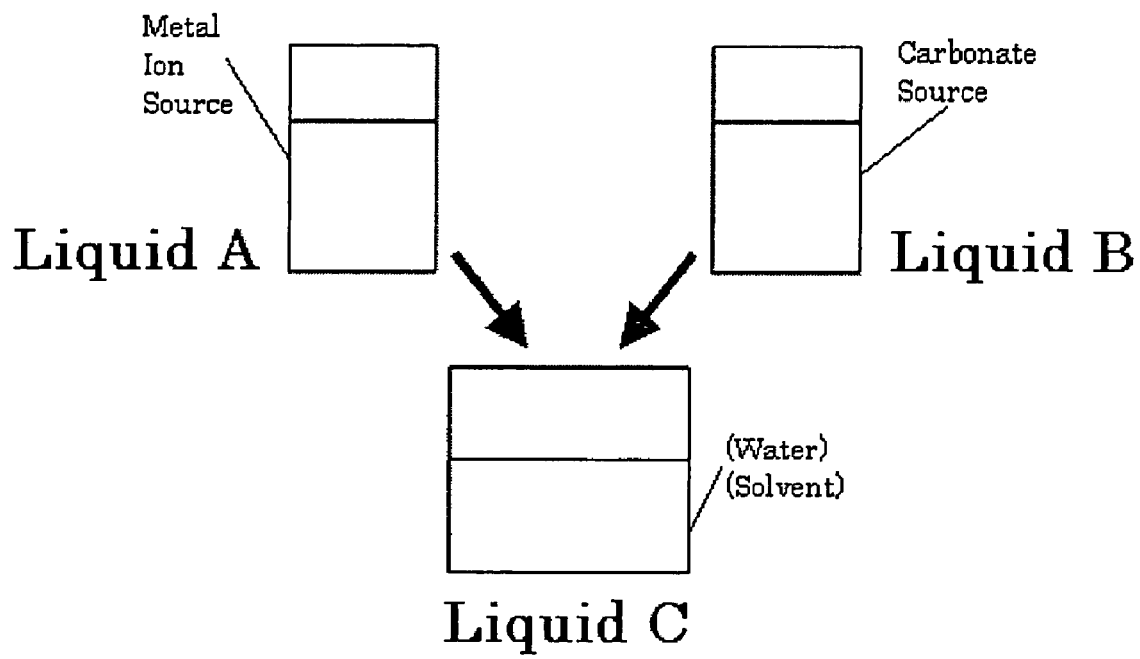

CARBONATE CRYSTAL, MANUFACTURING METHOD THEREOF, AND TRANSPARENT OPTICAL RESIN COMPOSITION

TECHNICAL FIELD

The present invention relates to a carbonate crystal, which has oriented birefringence, is needle- or rod-like and is able to negate the birefringence without sacrificing the light transmittance of a transparent polymeric resin when it exists in the polymeric resin, a manufacturing method of the carbonate crystal, and a transparent optical resin composition comprising the carbonate crystal.

BACKGROUND ART

Carbonates such as calcium carbonate have long been widely used in areas such as rubber, plastics and papermaking. Recently, many types of carbonates with high functionality have been developed and put into practical use for a variety of applications and purposes according to particle shapes and diameters.

Examples of crystal forms of the carbonate include calcite, aragonite and vaterite. Among these, aragonite is needle-like with superior hardness and coefficient of elasticity, and it may be used for versatile applications.

Commonly known manufacturing methods of the carbonates are, for example: (1) a reaction of a solution comprising carbonate ions with a chloride solution, and (2) a reaction of chloride with carbon dioxide. Also, Patent Literature 1 proposes a method regarding the method (1) to manufacture a needle-like aragonite-type carbonate, wherein a reaction of a solution comprising carbonate ions with a chloride solution takes place under ultrasonic irradiation. In addition, regarding a method of introducing carbon dioxide into water slurry of $Ca(OH)_2$, Patent Literature 2 proposes a method to place a seed crystal of needle-like aragonite in $Ca(OH)_2$ water slurry and grow the seed crystal only in a certain direction.

However, the carbonate obtained with the manufacturing method described in Patent Literature 1 is not only oversized of 30 μm to 60 μm in length but also has a wide distribution in the particle size; a carbonate controlled for a desired particle size may not be obtained. Furthermore, there is a problem that only a large particle with 20 μm to 30 μm in length may be obtained even with the manufacturing method of a carbonate described in Patent Literature 2.

On the other hand, the majority of optical-glass products such as glass lens and camera lens have been replaced by polymeric optical materials because of the lightness, superior mass productivity, and simplicity in application of molding technologies such as injection molding and extrusion molding. However, there is a problem that a product obtained from the molding of the common polymeric optical materials exhibits birefringence.

A polymeric optical material with birefringence does not cause a problem when it is applied to optical elements not requiring relatively high precision. However, optical materials with higher precision have been demanded recently, and birefringence is a big issue in case of, for example, a writable/erasable magneto-optical disk. A semiconductor laser beam is used for reading and writing this kind of magneto-optical disk; the existence of an optical element with birefringence in the disk itself and in the lens, for example, on the light path have an adverse effect on the precision in reading or writing.

Given this factor, Patent Literature 3 proposes a non-birefringent optical resin material comprising a polymeric material and an inorganic fine particle with different signs of birefringence from each other for the purpose of reducing the birefringence. The optical resin material of this proposal is obtained with a method called crystal doping, wherein, for example, a number of inorganic fine particles are dispersed in a polymeric resin, and the bonding chains in the polymeric resin and the inorganic fine particles are oriented in an approximately parallel direction by an external application of a molding force such as drawing to diminish the birefringence caused by the orientation of the bonding chain in the polymeric resin with the birefringence of the inorganic fine particles having an opposite sign.

As stated above, inorganic fine particles that may be used for crystal doping is essential in order to obtain a non-birefringent optical resin material through crystal doping. The inorganic fine particles are required to have a shape with a high aspect ratio such as a needle- or rod-like carbonate. Carbonate particles which do not influence the light transmittance, which is an important function as an optical material, is demanded. In addition, the average particle size of carbonate crystals need to be sufficiently small compared to the wavelength of a light source to reduce the effect of light scattering by particles as much as possible so that it does not affect the light transmittance.

However, there is a tendency that the effect of light scattering by particles increases with shorter wavelength of a light source. Also, there is an increasing percentage of products in which the optical information volume is increased by employing a light source with shorter wavelength of about 400 nm typified by a blue semiconductor laser beam. Therefore, reduced light scattering with smaller average particle diameter does not suffice. An engineering development that suppresses the reduction of transmittance in the visible short-wavelength region of around 400 nm is now strongly desired.

Patent Literature 1 Japanese Patent Application Laid-Open (JP-A) No. 59-203728

Patent Literature 2 Specification of the U.S. Pat. No. 5,164,172

Patent Literature 3 International Publication WO No. 01/25364

DISCLOSURE OF INVENTION

The object of the present invention is to resolve the problem and accomplish the purposes below. That is, the object of the present invention is to provide a carbonate crystal, which has oriented birefringence, is needle- or rod-like, and is able to negate the birefringence without sacrificing the light transmittance of a polymeric resin where the carbonate crystal exists; a manufacturing method of the carbonate crystal; and a transparent optical resin composition comprising the carbonate crystal.

The inventor of the present invention investigated further to find that it was significantly important to uniform the size of each carbonate particle against the light wavelength since only the reduction of the average particle diameter was insufficient. In other words, a transparent optical resin composition which is able to negate the birefringence without sacrificing the light transmittance may be obtained by employing a carbonate crystal, wherein the carbonate crystal is obtained from a liquid-phase reaction of a metal ion source comprising at least one metal ion selected from $Sr^{2+}$, $Ca^{2+}$, $Ba^{2+}$, $Zn^{2+}$ and $Pb^{2+}$ with a carbonate source; an aspect ratio is two or greater; an average major axis length is 400 nm or shorter; and a variation coefficient calculated from a given formula of a major axis is 0.40 or less.

The present invention is based on the findings of the inventor, and the method of solving the problem is as follows:

<1> A carbonate crystal which has an aspect ratio of two or greater, an average major axis length of 400 nm or shorter, and a variation coefficient of the major axis expressed by Formula (1) below of 0.40 or less:

$$\frac{1}{r} \times \left\{ \frac{1}{n-1} \sum_{i=1}^{n} (r_i - r)^2 \right\}^{\frac{1}{2}} \quad \text{Formula (1)}$$

where r denotes an average major axis length, n denotes the number of particles used for the measurement of the major axis length, and $r_i$ denotes the major axis length of the $i^{th}$ particle measured.

<2> the carbonate crystal according to <1>, wherein the variation coefficient of the major axis is 0.30 or less.

<3> the carbonate crystal according to any one of <1> to <2>, wherein the carbonate crystal may be obtained from a liquid-phase reaction of a metal ion source comprising a metal ion selected from $Sr^{2+}$, $Ca^{2+}$ and $Ba^{2+}$ with a carbonate source.

<4> the carbonate crystal according to <3>, wherein the metal ion source is any one of hydroxide and chloride, and the carbonate source is any one of sodium carbonate, ammonium carbonate and carbon dioxide.

Regarding the carbonate crystal according to any one of <1> to <4>, the aspect ratio is two or greater, the average major axis length is 400 nm or shorter and the variation coefficient of the major axis calculated from Formula (1) above is 0.40 or less. Therefore, it may be used for a variety of purposes. Its application to a non-birefringent optical resin material is also possible.

<5> A method of manufacturing the carbonate crystal according to any one of <1> to <4>, wherein the carbonate crystal is produced by reacting in a liquid a metal ion source comprising a metal ion selected from $Sr^{2+}$, $Ca^{2+}$, $Ba^{2+}$, $Zn^{2+}$ and $Pb^{2+}$ and a carbonate source.

<6> The manufacturing method of the carbonate crystal according to <5>, wherein the carbonate crystal is produced by reacting in a liquid the metal ion source and the carbonate source at 3° C. to 25° C.

<7> The manufacturing method of the carbonate crystal according to any one of <5> to <6>, wherein the carbonate crystal is produced by reacting in a liquid the metal ion source and the carbonate source at a pH of 9.0.

<8> The manufacturing method of the carbonate crystal according to any one of <5> to <7>, wherein the carbonate crystal is produced by simultaneously introducing in a liquid the metal ion source and the carbonate source for reaction.

<9> The manufacturing method of the carbonate crystal according to any one of <5> to <8>, wherein the carbonate crystal is produced by reacting the metal ion source and the carbonate source under the presence of alcohols.

<10> The manufacturing method of the carbonate crystal according to any one of <5> to <9>, wherein 0.05 mol/L or greater of the metal ion source is used.

<11> The manufacturing method of the carbonate crystal according to any one of <5> to <10>, wherein the manufacturing method comprises a drying process to dry the carbonate crystal obtained from the reaction of the metal ion source with the carbonate source.

Regarding the manufacturing method of the carbonate crystal according to any one of <5> to <10>, a carbonate with birefringence and a large aspect ratio may be formed easily and efficiently.

<12> A transparent optical resin composition, including the carbonate crystal according to any one of <1> to <4>, and a resin.

<13> The transparent optical resin composition according to <12>, wherein the transmittance of a light with a wavelength of 450 nm is 86% or greater.

<14> The transparent optical resin composition according to any one of <12> to <13>, wherein the transmittance of a light with a wavelength of 450 nm is 86.5% or greater.

<15> The transparent optical resin composition according to any one of <12> to <14>, wherein the resin is any one selected from a cellulose acylate resin, a polyethylene terephthalate resin, a polyethylene naphthalate resin and a polycarbonate resin.

<16> The transparent optical resin composition according to <15>, wherein the resin is a polycarbonate resin.

BRIEF DESCRIPTION OF DRAWINGS

FIG. 1 is a schematic diagram describing the double jet manufacturing method of a carbonate crystal according to the present invention.

BEST MODE FOR CARRYING OUT THE INVENTION (Carbonate Crystal)

A carbonate crystal of the present invention may be obtained from a liquid-phase reaction of a metal ion source and a carbonate source, wherein the aspect ratio, the average major axis length and the variations in the major axis are within predetermined ranges.

-Metal Ion-

The metal ion is not restricted as long as it comprises a metal ion, and it may be selected depending on the application. The examples of the metal ion include $Sr^{2+}$, $Ca^{2+}$, $Ba^{2+}$, $Zn^{2+}$ and $Pb^{2+}$. Among these, the following alkali earth metal ions are more preferable in terms of reactivity: $Sr^{2+}$ ion, $Ca^{2+}$ ion, $Ba^{2+}$. A metal ion that reacts with the carbonate source to produce a carbonate with any one of calcite, aragonite, vaterite and amorphous geometries is most preferable.

The crystal structure of the aragonite is expressed with a $CO_3^{2-}$ unit, and the $CO_3^{2-}$ units are laminated to form a needle- or rod-like carbonate. Therefore, the anisotropy occurs in the crystalline structure, and it becomes a biaxial, negative optical crystal since the refractive indices differ depending on the direction of the crystal axis. In particular, the refractive index in c-axis direction is small compared to those in other two directions, and the value of the birefringence is large. Table 1 below shows the birefringence in the direction of the respective crystal axes of carbonate particles with $Ca^{2+}$, $Sr^{2+}$, $Ba^{2+}$ and $Pb^{2+}$ metal ions. When the carbonate is drawn in any one direction in a drawing process mentioned hereinafter, the crystal is aligned in the direction of the major axis of the particles that coincides with the drawing direction. Therefore, the oriented birefringence of a resin may be controlled by mixing the carbonate with a resin having positive birefringence.

TABLE 1

|  | α | β | γ | δ | Specific Gravity |
|---|---|---|---|---|---|
| $CaCO_3$ | 1.530 | 1.681 | 1.685 | 0.155 | 2.94 |
| $SrCO_3$ | 1.520 | 1.667 | 1.669 | 0.149 | 3.75 |
| $BaCO_3$ | 1.529 | 1.676 | 1.677 | 0.148 | 4.29 |
| $PbCO_3$ | 1.804 | 2.076 | 2.078 | 0.274 | 6.55 |

The metal ion source is not restricted as long as it comprises a metal ion selected from $Sr^{2+}$, $Ca^{2+}$, $Ba^{2+}$, $Zn^{2+}$ and $Pb^{2+}$, and it may be properly selected depending on the application. Examples of the metal ion include a nitrate salt, a chloride and a hydroxide of Sr, Ca, Ba, Zn and Pb. Among these, the metal ion is most preferably a hydroxide and a chloride in terms of reactivity.

The metal ion source preferably comprises $NO_3-$, $Cl-$ and $OH-$. Therefore, $Sr(NO_3)_2$, $Ca(NO_3)_2$, $Ba(NO_3)_2$, $Zn(NO_3)_2$, $Pb(NO_3)_2$, $SrCl_2$, $CaCl_2$, $BaCl_2$, $ZnCl_2$, $PbCl_2$, $Sr(OH)_2$, $Ca(OH)_2$, $Ba(OH)_2$, $Zn(OH)_2$, $Pb(OH)_2$ and these hydrates may be given as preferable examples.

-Carbonate Source-

The carbonate source is not restricted as long as it produces a $CO_3^{2-}$ ion, and it may be properly selected depending on the application. Preferable examples include sodium carbonate ($Na_2CO_3$), ammonium carbonate (($NH_4)_2CO_3$), sodium bicarbonate ($NaHCO_3$), carbon dioxide and urea (($NH_2)_2CO$). Among these, in terms of reactivity, sodium carbonate, ammonium carbonate and carbon dioxide are most preferable.

-Aspect Ratio, Average Major Axis Length and Variation in Major Axis-

The present invention relates to a technology to compensate oriented birefringence of a transparent resin arising from the molecular orientation by developing particle orientation along the molecular orientation. Therefore, the aspect ratio of a carbonate particle is required to be two or greater, preferably 3.0 to 20. When the carbonate crystal is almost granular or spherical with the aspect ratio of less than two, the occurrence of the particle orientation along the molecular orientation of the transparent resin becomes less probable, or it does not occur at all. Consequently, the present invention becomes ineffective.

The average major axis length of the carbonate crystal according to the present invention is preferably shorter than the visible wavelength of approximately 400 nm to 780 nm in order to suppress as much as possible the decrease in transmittance of the transparent optical resin. Therefore, it should be 400 nm or shorter. It is preferably 300 nm or shorter, and more preferably 200 nm or shorter. The effect of Mie scattering by particles increases when the average major axis length is longer than 400 nm. This accelerates the decrease in transmittance, and the material loses its value as a transparent optical material.

Regarding the variation in the major axis, the variation coefficient of the major axis should be 0.40 or less in order to achieve a practically low light-scattering status by reducing the content of the particles that cause the decrease in transmittance due to light scattering. The variation coefficient of a major axis is expressed as a ratio of the standard deviation of the major axis to the average major axis length, and it may be obtained from Formula (1) below:

$$\frac{1}{r} \times \left\{ \frac{1}{n-1} \sum_{i=1}^{n} (r_i - r)^2 \right\}^{\frac{1}{2}} \quad \text{Formula (1)}$$

where r denotes the average major axis length, n the number of particles used for the measurement of the major axis length, and $r_i$ the major axis length of the $i^{th}$ particle measured.

The value of n is preferably large. Although it is set at 100 or greater, the value of n is more preferably 200 or greater. The particle distribution may not be accurately represented with the value of n less than 100. When the variation coefficient is expressed in percentage, the value obtained from above Formula (1) is multiplied by 100. For example, a variation coefficient of 0.40 or less may be expressed as a variation coefficient of 40% or less.

The variation coefficient of a major axis is preferably small. More specifically, it is preferably 0.30 or less, and more preferably 0.20 or less. When the variation coefficient of a major axis is greater than 0.40, there is a possibility of an adverse effect that the light transmittance decreases due to the increase in the mixing ratio of the particles with the major axis longer than average.

The particle diameter, the aspect ratio and the variation coefficient of a carbonate crystal of the present invention may be obtained by the following procedure, for example: well-dispersed carbonate particles are observed with a transmission electron microscope; the shot image of the particles is scanned and saved as an image file; the image file information is opened with Mac-View Ver. 3, a particle size distribution analysis software manufactured by Mountech Co., Ltd., and each of the particles is measured; and finally the results are calculated.

-Transmittance of 450-nm Light-

The transmittance of a light with a wavelength of 450 nm through an optical resin, which comprises a resin with an addition of a carbonate crystal of the present invention, is preferably 86% or greater, more preferably 86.5% or greater, and most preferably 87% or greater for an application as a transparent optical material.

Also, when the transmittance of a 450-nm light through a resin film with a thickness of 100 μm is x % and the transmittance of the 450-nm light through a resin film comprising a carbonate crystal is y %, the ratio of y to x is preferably 0.98 or greater, more preferably 0.99 or greater, and most preferably one. When the ratio of y to x is less than 0.98, the resin to which the carbonate crystal is added may lose its transparency.

(Manufacturing Method of Carbonate Crystal)

A carbonate crystal manufacturing method of the present invention comprises a process to obtain a carbonate crystal of the present invention from a liquid-phase reaction of the metal ion source and the carbonate source and optionally other processes.

-Reaction Method-

A method of the liquid-phase reaction is not restricted, and it may be properly selected depending on the application. In terms of reactivity, an exemplary method is a reaction in which the metal ion source and the carbonate source are simultaneously introduced in a liquid.

More specifically, a double jet method is given as an example of the method to introduce the metal ion source and the carbonate source in a liquid for reaction includes.

-Double Jet Method-

The double jet method is a reaction method in which the metal ion source and the carbonate source are injected over the surface of or into the liquid. For example, as shown in FIG. 1, a liquid A comprising the metal ion source and a liquid B comprising the carbonate source are injected simultaneously into C, and these are reacted in the liquid C.

The injection speed of the metal ion source and the carbonate source according to the double jet method is not restricted, and it may be properly chosen depending on the application. It is preferably fast; the preferable injection speed is, for example, a speed such that the injection of the total amount of the adding material completes within one minute. Furthermore, a molar injection speed is preferably determined based on the stoichiometric ratio of the final product. In the present invention, it is most preferably an equimolar speed.

The double jet method may be exercised with the use of a double jet reactive crystallization apparatus. The apparatus comprises mixing blades, and nozzles for supplying a reactive solution are equipped near the mixing blades of the apparatus. There are two or more multiple nozzles. The metal ion source (the liquid A) and the carbonate source (the liquid B) supplied from the nozzles rapidly become homogeneous by the mixing action of the mixing blades, and an instantaneous, uniform reaction is possible in the liquid C.

Here, the mixing speed in the double jet method is preferably 500 rpm to 1,500 rpm.

-Temperature-

The temperature of the liquid in which the reaction of the metal ion source and the carbonate source takes place is preferably 3° C. to 25° C., and more preferably 3° C. to 20° C. When the liquid temperature is below 3° C., a spherical or ellipsoidal carbonate may be produced instead of a needle- or rod-like carbonate. When the liquid temperature is over 25° C., the size of the primary particle becomes too large, and a carbonate with an aspect ratio of 2 or greater in a nano-size region may not be obtained.

-pH-

The pH of the liquid in which the reaction of the metal ion source and the carbonate source takes place is preferably in an alkaline condition under which a needle- or rod-like carbonate crystal is easily obtained. More specifically, it is preferably nine or greater, and more preferably 9.5 or greater. When the pH of the liquid is less than nine, the resin to which the carbonate crystal is added may lose its transparency.

In addition, the above-specified pH is maintained from the start to the end of the reaction when the metal ion source comprises an OH group. When the metal ion source does not comprise an OH group, the liquid is preferably adjusted to the above-specified pH for the reaction by adding an alkalifying substance such as NaOH.

-Injection Concentration-

The injection concentrations of the metal ion source and the carbonate source are not restricted, and they may be properly chosen depending on the application. The injection concentration of the metal ion source is preferably 0.05 mol/L or greater, and more preferably 0.10 mol/L.

-Other Processes-

The reaction of the metal ion source and the carbonate source preferably takes place under the presence of an organic solvent.

The organic solvent is not restricted and may be properly selected depending on the application. Preferable examples of the organic solvent include methanol, ethanol, 1-propanol, isopropyl alcohol, 2-aminoethanol, 2-methoxyethanol, acetone, tetrahydrofuran, 1,4-dioxane, N,N-dimethylformamide, N,N-dimethylacetamide, N-methylpyrrolidone, 1,3-dimethyl-2-imidazolidone and dimethylsulfoxide. These may be used individually, or two or more types may be combined. Among these, alcohols are most preferable; methanol, ethanol, isopropyl alcohol and 2-aminoethanol are more preferred in terms of reactivity and easy procurement of material.

The amount of the solvent added is preferably 1% to 50%, and more preferably 5% to 40%, wherein the percentages are based on the volume of the solvent after the production of the carbonate.

Also, when a carbonate crystal is obtained from a reaction of the metal ion source and the carbonate source, the carbonate crystal is preferably dried in a drying process.

The method of drying the carbonate crystal in the drying process is not restricted and may be properly selected depending on the application. Filtration is an example of the drying method.

-Application-

The method of manufacturing a carbonate crystal according to the present invention enables an easy and efficient production of a carbonate having oriented birefringence and a large aspect ratio. Therefore, it may be preferably applied to the production of the carbonate crystal of the present invention.

(Transparent Optical Resin Composition)

A transparent optical resin composition of the present invention comprises a carbonate crystal of the present invention, a resin and optionally other components.

The transparent optical resin composition is a polymeric resin material that constitutes a matrix of an optical resin material. Any polymeric resin material may be used as long as it has the transparency necessary for application as the objective optical resin material and other necessary properties. The composition preferably comprises a certain level of transparency for the use as an optical resin material.

-Resin-

The resin is not restricted and may be properly selected depending on the application. Examples of the resin include polyolefins such as polyethylene and polypropylene; aromatic vinyl polymers such as polystyrene; a poly(meth)acrylic esters such as polymethylmethacrylate; polyphenylene oxide, polycarbonate, polyvinyl chloride, polyethylene terephthalate, polyethylene naphthalate, cyclohexyl methacrylate, cellulose acylate, alicyclic polyolefin (for example, a cyclic olefin ring-opening polymer or copolymer such as norbornene polyolefin); and a copolymer of alicyclic(meth)acrylate such as isobornyl methacrylate and (meth)acrylphenylene ether. Among these, polyethylene terephthalate, polyethylene naphthalate, cellulose acylate and polycarbonate comprise preferable optical and physical properties, and polycarbonate is most preferable since it sufficiently develops an advantageous effect of the present invention even with an incident light in an oblique direction.

-Application-

The characteristic birefringence values of resins comprising birefringence have been documented, for example, by Fumio Ide on page 29 of 'Contemporary transparent resins—the world of high-performance optical material for challenging IT—' (in Japanese; Kogyo Chosakai Publishing, Inc.; first edition), and are listed in Table 2. Table 2 indicates that the most of the resins comprises positive birefringence. Also, the addition of a strontium carbonate as the above carbonate to, for example, the polycarbonate as an optical polymer may not only turn the birefringence zero by diminishing the positive birefringence of the resin but also turn it negative. Therefore, a carbonate crystal of the present invention may be employed preferably for a resin comprising optical parts, and more preferably a resin comprising optical elements with which birefringent properties are important and high precision is required.

TABLE 2

| Polymer | Birefringence |
| --- | --- |
| Polystyrene | −0.10 |
| Polyphenylene Ether | 0.21 |
| Polycarbonate | 0.106 |
| Polyvinyl Chloride | 0.027 |
| Polymethylmethacrylate | −0.0043 |

TABLE 2-continued

| Polymer | Birefringence |
|---|---|
| Polyethylene Terephthalate | 0.105 |
| Polyethylene | 0.044 |

EXAMPLE

Hereinafter, the present invention will be illustrated in more detail with reference to examples given below, but these are not to be construed as limiting the present invention.

Experiment 1

Example 1

-Preparation of Carbonate Crystal-

First, 700 mL of a 0.25 mol/L strontium hydroxide suspension as a metal ion source was mixed with 300 mL of ethanol, and the solution was cooled to 8° C. Then, 700 mL of a 0.17 mol/L ammonium carbonate solution as a carbonate source was mixed and agitated for an instantaneous reaction. The pH of the reacting solution was 12.8.

Next, while stirring the reacting liquid, carbon dioxide as a carbonate source was supplied in excess compared to the metal ion source. A silane coupling agent (3-glycidoxypropyltrimethoxysilane) was at 25% by mass against strontium carbonate, and the solution was sufficiently mixed for surface treatment.

Finally, the solution was washed and filtered followed by drying, and a strontium carbonate crystal T-1 was obtained. The crystal was observed with a transmission electron microscope, and the major axis of 150 particles was measured with Mac-View Ver. 3. It was found that the aspect ratio was 3.7, the average major axis length was 365 nm, and the variation coefficient of the major axis found by Formula (1) below was 0.36:

$$\frac{1}{r} \times \left\{ \frac{1}{n-1} \sum_{i=1}^{n} (r_i - r)^2 \right\}^{\frac{1}{2}} \quad \text{Formula (1)}$$

where r denotes an average major axis length, n the number of particles used for is the measurement of the major axis length, and $r_i$ the major axis length of the $i^{th}$ particle measured.

Example 2

-Preparation of Carbonate Crystal-

First, 300 mL of ethanol was added to 300 mL of an NaOH solution which had previously been cooled to 10° C. To this solution, a 0.25 mol/L strontium chloride solution as a metal ion source and a 0.2 mol/L sodium carbonate solution as a carbonate source were simultaneously added and mixed, and the mixture was reacted with agitation while the concentration of the strontium was adjusted at 0.1 mol/L. The pH of the reacting solution was 11.8.

Next, after a 0.3 mol/L strontium chloride solution as a metal ion source was added, carbon dioxide as a carbonate source was supplied in excess compared to the metal ion source while stirring the reacting liquid. A silane coupling agent (3-glycidoxypropyltrimethoxysilane) was added at 25% by mass against strontium carbonate, and the solution was sufficiently mixed for surface treatment.

Finally, the solution was washed and filtered followed by drying, and a strontium carbonate crystal T-2 was obtained. The crystal was observed similarly to Example 1. It was found that the aspect ratio was 4.3, the average major axis length was 345 nm, and the variation coefficient of the major axis was 0.34.

Example 3

-Preparation of Carbonate Crystal-

First, 700 mL of a 0.30 mol/L strontium chloride solution as a metal ion source and 250 mL of ethanol were mixed and cooled to 10° C. To this solution, 700 mL of a 0.15 mol/L sodium carbonate solution as a carbonate source was added and mixed, and the mixture was reacted with agitation. The pH of the reacting solution was 8.0. Then, carbon dioxide was supplied to the stirred solution.

Next, a silane coupling agent (3-glycidoxypropyltrimethoxysilane) was added at 25% by mass against strontium carbonate, and the solution was sufficiently mixed for surface treatment.

Finally, the solution was washed and filtered followed by drying, and a strontium carbonate crystal T-3 was obtained. The crystal was observed with a transmission electron microscope, and the major axis of multiple particles was measured. It was found that the average major axis length was 380 nm, the aspect ratio was 2.1, and the variation coefficient of the major axis was 0.35.

Comparative Example 1

-Preparation of Carbonate Crystal-

A strontium carbonate crystal H-1 was obtained in the same manner as Example 1, except that the temperature of the reactive liquid was set at 45° C. The crystal was observed similarly to Example 1. It was found that the aspect ratio was 4.3, the average major axis length was 730 nm, and the variation coefficient of the major axis was 0.48.

Comparative Example 2

-Preparation of Carbonate Crystal-

A strontium carbonate crystal H-2 was obtained in the same manner as Example 2, except that the temperature and pH of the reactive liquid were set at 35° C. and eight, respectively, and that the strontium chloride solution was added before the sodium carbonate solution.

The crystal was observed similarly to Example 1. It was found that the aspect ratio was 1.8, the average major axis length was 590 nm, and the variation coefficient of the major axis was 0.54.

Experiment 2

Example 4

-Measurement of Birefringence and 450-nm Light Transmittance-

The strontium carbonate crystal T-1, prepared in Example 1, was mixed at 0.8% by mass with a polycarbonate (molecular weight of 22,000), and the mixture was dissolved with dichloromethane. After ultrasonic irradiation, the mixture was sufficiently defoamed. A film with a thickness of 100 μm was prepared with the obtained dispersion solution by casting method. The transmittance y (%) of a 450-nm light through the prepared film was measured, and y to x was found, where x is the transmittance of a 450-nm light through a resin film with a thickness of 100 μm.

Then, after the film was uniaxially drawn under conditions of a drawing temperature of 200° C. and a draw ratio of 1.7 with TENSILON Universal Testing Machine (manufactured by ORIENTEC Co., Ltd.), the birefringence was measured with Automatic Birefringence Analyzer (KOBRA-21ADH, manufactured by Oji Scientific Instruments Co., Ltd.) with a wavelength of 550±5 nm. The results are shown in Table 3.

Example 5

-Measurement of Birefringence and 450-nm Light Transmittance-

The birefringence was measured in the same manner as Example 4 except that the carbonate crystal was replaced with the strontium carbonate crystal T-2 prepared in Example 2. Also, the transmittance y (%) of a light with a wavelength of 450 nm was measured, and y to x was obtained. The results are shown in Table 3.

Example 6

-Measurement of Birefringence and 450-nm Light Transmittance-

The birefringence was measured in the same manner as Example 4 except that the carbonate crystal was replaced with the strontium carbonate crystal T-3 prepared in Example 3. Also, the transmittance y (%) of a light with a wavelength of 450 nm was measured, and y to x was obtained. The results are shown in Table 3.

Comparative Example 3

-Measurement of Birefringence and 450-nm Light Transmittance-

The birefringence was measured in the same manner as Example 4 except that the carbonate crystal was replaced with the strontium carbonate crystal H-1 prepared in Comparative Example 1. Also, the transmittance y (%) of a light with a wavelength of 450 nm was measured, and y to x was obtained. The results are shown in Table 3.

Comparative Example 4

-Measurement of Birefringence and 450-nm Light Transmittance-

The birefringence was measured in the same manner as Example 4 except that the carbonate crystal was replaced with the strontium carbonate crystal H-2 prepared in Comparative Example 2. Also, the transmittance y (%) of a light with a wavelength of 450 nm was measured, and y to x was obtained. The results are shown in Table 3.

Comparative Example 5

-Measurement of Birefringence and 450-nm Light Transmittance-

The birefringence was measured in the same manner as Example 4 except that the carbonate crystal was not added. Also, the transmittance y (%) of a light with a wavelength of 450 nm was measured, and y to x was obtained. The results are shown in Table 3.

TABLE 3

| | Carbonate Crystal | Birefringence | Transmittance of 450-nm Light (%) | y/x |
|---|---|---|---|---|
| Example 4 | T-1 | $4 \times 10^{-4}$ | 88.0 | 1.00 |
| Example 5 | T-2 | $4 \times 10^{-4}$ | 88.0 | 1.00 |
| Example 6 | T-3 | $4 \times 10^{-4}$ | 87.3 | 0.99 |
| Comparative Example 3 | H-1 | $5 \times 10^{-4}$ | 84.5 | 0.96 |
| Comparative Example 4 | H-2 | $5 \times 10^{-4}$ | 85.4 | 0.97 |
| Comparative Example 5 | None | $12 \times 10^{-4}$ | 88.0 | 1.00 |

The results shown in Table 3 indicate that the polycarbonate resin compositions comprising the carbonate crystals of the present invention prepared in Examples 4 to 6 have less reduction in the light transmittance of the resins and are able to dismiss effectively the birefringence compared to Comparative Examples 3 to 5

Experiment 3

Example 7

-Preparation of Carbonate Crystal-

First, 700 mL of a 0.25 mol/L strontium hydroxide suspension as a metal ion source was mixed with 900 mL of methanol, and the solution was cooled to 5° C. Then, 700 mL of a 0.17 mol/L ammonium carbonate solution as a carbonate source was mixed and agitated for an instantaneous reaction. The pH of the reacting solution was 12.8.

Next, while stirring the reacting liquid, carbon dioxide as a carbonate source was supplied in excess compared to the metal ion source. A titanate coupling agent (PLENACT KR44, manufactured by Ajinomoto Fine-Techno Co., Ltd.) was added at 4% by mass against strontium carbonate, and the solution was sufficiently mixed for surface treatment.

Finally, the solution was washed and filtered followed by drying, and a strontium carbonate crystal T-4 was obtained. The crystal was observed with a transmission electron microscope, and the major axis of 150 particles was measured with Mac-View Ver. 3. It was found that the aspect ratio was 6.2, the average major axis length was 320 nm, and the variation coefficient of the major axis found by Formula (1) below was 0.28:

$$\frac{1}{r} \times \left\{ \frac{1}{n-1} \sum_{i=1}^{n} (r_i - r)^2 \right\}^{\frac{1}{2}} \quad \text{Formula (1)}$$

where r denotes an average major axis length, n the number of particles used for the measurement of the major axis length, and $r_i$ the major axis length of the $i^{th}$ particle measured.

Example 8

-Preparation of Carbonate Crystal-

First, 600 mL of methanol was added to 300 mL of an NaOH solution which had previously cooled to 10° C. To this solution, a 0.25 mol/L strontium chloride solution as a metal ion source and a 0.25 mol/L sodium carbonate solution as a carbonate source were simultaneously added and mixed, and the mixture was reacted with agitation. The pH of the reacting solution was 12.8.

Next, after a 0.3 mol/L strontium chloride solution as a metal ion source was added, carbon dioxide as a carbonate source was supplied in excess compared to a metal ion source while stirring the reacting liquid. A titanate coupling agent (PLENACT KR44, manufactured by Ajinomoto Fine-Techno Co., Ltd.) was added at 4% by mass against strontium carbonate, and the solution was sufficiently mixed for surface treatment.

Finally, the solution was washed and filtered followed by drying, and a strontium carbonate crystal T-5 was obtained. The crystal was observed similarly to Example 7. It was found that the aspect ratio was 4.3, the average major axis length was 345 nm, and the variation coefficient of the major axis was 0.37.

Example 9

First, 700 mL of a 0.30 mol/L strontium chloride solution as a metal ion source and 300 mL of methanol were mixed and cooled to 10° C. To this solution, 700 mL of a 0.15 mol/L sodium carbonate solution as a carbonate source was added and mixed, and the mixture was reacted with agitation. The pH of the reacting solution was 8.0. Then, carbon dioxide was supplied to the stirred solution.

Next, a titanate coupling agent (PLENACT KR44, manufactured by Ajinomoto Fine-Techno Co., Ltd.) was added at 25% by mass against strontium carbonate, and the solution was sufficiently mixed for surface treatment.

Finally, the solution was washed and filtered followed by drying, and a strontium carbonate crystal T-6 was obtained. The crystal was observed with a transmission electron microscope, and the major axis of multiple particles was measured. It was found that the average major axis length was 380 nm, the aspect ratio was 2.4, and the variation coefficient of the major axis was 0.35.

Comparative Example 6

-Preparation of Carbonate Crystal-

A strontium carbonate crystal H-3 was obtained in the same manner as Example 7, except the amount of methanol in the reactive liquid was changed to 400 mL, the temperature of methanol was set at 18° C., and that the reactive temperature of carbon dioxide was changed to 38° C.

The crystal was observed similarly to Example 7. It was found that the aspect ratio was 4.1, the average major axis length was 370 nm, and the variation coefficient of the major axis was 0.65.

Comparative Example 7

-Preparation of Carbonate Crystal-

A strontium carbonate crystal H-4 was obtained in the same manner as Example 8, except the temperature of the reactive liquid was set at 35° C., the pH was set at 8, and that the strontium chloride solution was added before the sodium carbonate solution.

The crystal was observed similarly to Example 7. It was found that the aspect ratio was 1.7, the average major axis length was 670 nm, and the variation coefficient of the major axis was 0.54.

Experiment 4

Example 10

-Measurement of Birefringence and 450-nm Light Transmittance-

The strontium carbonate crystal T-4, prepared in Example 7, was mixed at 0.5% by mass with a polycarbonate (molecular weight of 22,000). Having heated at 120° C. for eight hours, the mixture was kneaded at 220° C. After kneading, the resin in the form of pellets was melted at 220° C. for injection molding, and a film with a thickness of 100 μm was prepared by pressure molding. The transmittance y (%) of a 450-nm light through the prepared film was measured, and y to x was found.

Then, after the film was uniaxially drawn under conditions of a drawing temperature of 170° C. and a draw ratio of 1.6 with TENSILON Universal Testing Machine (manufactured by ORIENTEC Co., Ltd.), the birefringence was measured with Automatic Birefringence Analyzer (KOBRA-21ADH, manufactured by Oji Scientific Instruments Co., Ltd.) at a wavelength of 550±5 nm. The results are shown in Table 4.

Example 11

-Measurement of Birefringence and 450-nm Light Transmittance-

The birefringence was measured in the same manner as Example 10 except that the carbonate crystal was replaced with the strontium carbonate crystal T-5 prepared in Example 8. Also, the transmittance y (%) of a light at a wavelength of 450 nm was measured, and y to x was obtained. The results are shown in Table 4.

Example 12

-Measurement of Birefringence and 450-nm Light Transmittance-

The birefringence was measured in the same manner as Example 10 except that the carbonate crystal was replaced with the strontium carbonate crystal T-6 prepared in Example 9. Also, the transmittance y (%) of a light at a wavelength of 450 nm was measured, and y to x was obtained. The results are shown in Table 4.

Comparative Example 8

-Measurement of Birefringence and 450-nm Light Transmittance-

The birefringence was measured in the same manner as Example 10 except that the carbonate crystal was replaced with the strontium carbonate crystal H-3 prepared in Comparative Example 6. Also, the transmittance y (%) of a light at a wavelength of 450 nm was measured, and y to x was obtained. The results are shown in Table 4.

Comparative Example 9

-Measurement of Birefringence and 450-nm Light Transmittance-

The birefringence was measured in the same manner as Example 10 except that the carbonate crystal was replaced with the strontium carbonate crystal H-4 prepared in Comparative Example 7. Also, the transmittance y (%) of a light at a wavelength of 450 nm was measured, and y to x was obtained. The results are shown in Table 4.

Comparative Example 10

-Measurement of Birefringence and 450-nm Light Transmittance-

The birefringence was measured in the same manner as Example 10 except that the carbonate crystal was not added. Also, the transmittance y (%) of a light at a wavelength of 450 nm was measured, and y to x was obtained. The results are shown in Table 4.

TABLE 4

| | Carbonate Crystal | Birefringence | Transmittance of 450-nm Light (%) | y/x |
|---|---|---|---|---|
| Example 10 | T-4 | $1 \times 10^{-4}$ | 87.70 | 0.997 |
| Example 11 | T-5 | $2 \times 10^{-4}$ | 87.50 | 0.994 |
| Example 12 | T-6 | $2 \times 10^{-4}$ | 87.30 | 0.992 |
| Comparative Example 8 | H-3 | $2 \times 10^{-4}$ | 85.80 | 0.975 |
| Comparative Example 9 | H-4 | $5 \times 10^{-4}$ | 83.60 | 0.950 |
| Comparative Example 10 | — | $6 \times 10^{-4}$ | 88.00 | 1.000 |

The results shown in Table 4 indicate that the polycarbonate resin compositions comprising the carbonate crystals of the present invention prepared in Examples 10 to 12 have less reduction in the light transmittance of the resins and are able to dismiss effectively the birefringence compared to Comparative Examples 8 to 10.

Example 13

A polyethylene terephthalate resin composition comprising a strontium carbonate crystal was obtained by adding a 0.5% by mass of the strontium carbonate crystal T-4 prepared in Example 7 in a polycondensation reaction of terephthalic acid and ethylene glycol.

Similarly, polyethylene terephthalate resin compositions comprising strontium carbonate crystals T-5, T-6, H-3 and H-4, respectively, were prepared.

The transmittance and birefringence after drawing process for each of the resultant polyethylene terephthalate resin compositions were measured, and they were confirmed as equally effective as Example 10.

It was also confirmed that similar effects were obtained with polyethylene naphthalate resin composition and triacetylcellulose resin composition, respectively.

The present invention may resolve the existing problems and provide a carbonate crystal, which has oriented birefringence, is needle- or rod-like and is able to negate the birefringence without sacrificing the light transmittance of a transparent polymeric resin when it exists in the transparent resin; a manufacturing method of the carbonate crystal; and a transparent optical resin composition comprising the carbonate crystal.

Industrial Applicability

A carbonate crystal of the present invention, existing in a transparent resin, is able to negate the birefringence without sacrificing the light transmittance of the transparent resin.

A manufacturing method of a carbonate crystal according to the present invention may easily and efficiently produce a carbonate crystal comprising oriented birefringence and high aspect ratio; therefore, it may be preferably applied to, for example, the production of a carbonate crystal of the present invention.

A transparent optical resin composition comprising a carbonate crystal of the present invention is able to negate the birefringence without sacrificing the light transmittance; therefore, it may be preferably used as a resin material that constitutes an optical component, especially optical elements with which birefringent properties are important and high precision is required.

The invention claimed is:

1. Carbonate crystals which have an aspect ratio of two or greater, an average major axis length of 400 nm or shorter, and a variation coefficient of the major axis expressed by Formula (1) below of 0.40 or less:

$$\frac{1}{r} \times \left\{ \frac{1}{n-1} \sum_{i=1}^{n} (r_i - r)^2 \right\}^{\frac{1}{2}} \qquad \text{Formula (1)}$$

wherein r denotes an average major axis length, n denotes the number of particles used for the measurement of the major axis length and is 100 or greater, and $r_i$ denotes the major axis length of the $i^{th}$ particle measured.

2. The carbonate crystals according to claim 1, wherein the variation coefficient of the major axis is 0.30 or less.

3. The carbonate crystals according to claim 1, wherein the carbonate crystals are obtained from a reaction of a metal ion source comprising at least one metal ion selected from the group consisting of $Sr^{2+}$, $Ca^{2+}$ and $Ba^{2+}$ with a carbonate source in a liquid.

4. The carbonate crystals according to claim 3, wherein the metal ion source is selected from the group consisting of hydroxide and chloride, and the carbonate source is selected from the group consisting of sodium carbonate, ammonium carbonate and carbon dioxide.

5. A manufacturing method of carbonate crystals which have an aspect ratio of two or greater, an average major axis length of 400 nm or shorter, and a variation coefficient of the major axis expressed by Formula (1) below of 0.40 or less:

$$\frac{1}{r} \times \left\{ \frac{1}{n-1} \sum_{i=1}^{n} (r_i - r)^2 \right\}^{\frac{1}{2}} \qquad \text{Formula (1)}$$

wherein r denotes an average major axis length, n denotes the number of particles used for the measurement of the major axis length and is 100 or greater, and $r_i$ denotes the major axis length of the $i^{th}$ particle measured, wherein the carbonate crystals are produced by reacting in a liquid a metal ion source comprising at least one metal ion selected from the group consisting of $Sr^{2+}$, $Ca^{2+}$, $Ba^{2+}$, $Zn^{2+}$ and $Pb^{2+}$ and a carbonate source.

6. The manufacturing method of the carbonate crystals according to claim 5, wherein the carbonate crystals are produced by reacting in a liquid the metal ion source and the carbonate source at 3° C. to 25° C.

7. The manufacturing method of the carbonate crystals according to claim 5, wherein the carbonate crystals are produced by reacting in a liquid the metal ion source and the carbonate source at a pH of 9.0 or greater.

8. The manufacturing method of the carbonate crystals according to claim 5, wherein the carbonate crystals are produced by simultaneously introducing in a liquid the metal ion source and the carbonate source for reaction.

9. The manufacturing method of the carbonate crystals according to claim 5, wherein the carbonate crystals are produced by reacting the metal ion source and the carbonate source in the presence of alcohols.

10. The manufacturing method of the carbonate crystals according to claim 5, wherein 0.05 mol/L or greater of the metal ion source is used, 11. The manufacturing method of the carbonate crystals according to claim 5, wherein the manufacturing method comprises a drying process to dry the carbonate crystals obtained from the reaction of the metal ion source with the carbonate source.

12. A transparent optical resin composition comprising:
carbonate crystals, and
a resin,
wherein the carbonate crystals have an aspect ratio of two or greater, an average major axis length of 400 nm or shorter, and a variation coefficient of the major axis expressed by Formula (1) below of 0.40 or less:

$$\frac{1}{r} \times \left\{ \frac{1}{n-1} \sum_{i=1}^{n} (r_i - r)^2 \right\}^{\frac{1}{2}} \quad \text{Formula (1)}$$

wherein r denotes an average major axis length, n denotes the number of particles used for the measurement of the major axis length and is 100 or greater, and $r_i$ denotes the major axis length of the $i^{th}$ particle measured.

13. The transparent optical resin composition according to claim 12, wherein the transmittance of a light with a wavelength of 450 nm is 86% or greater.

14. The transparent optical resin composition according to claim 12, wherein the transmittance of a light with a wavelength of 450 nm is 86.5% or greater.

15. The transparent optical resin composition according to claim 12, wherein the resin is selected from the group consisting of a cellulose acylate resin, a polyethylene terephthalate resin, a polyethylene naphthalate resin and a polycarbonate resin.

16. The transparent optical resin composition according to claim 15, wherein the resin is a polycarbonate resin.

* * * * *